(12) United States Patent
Chen

(10) Patent No.: US 11,513,269 B2
(45) Date of Patent: Nov. 29, 2022

(54) MANUFACTURING METHOD OF COLOR FILM SUBSTRATE AND COLOR FILM SUBSTRATE

(71) Applicant: TCL China Star Optoelectronics Technology Co., Ltd., Shenzhen (CN)

(72) Inventor: Jie Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 443 days.

(21) Appl. No.: 16/627,292

(22) PCT Filed: Dec. 17, 2019

(86) PCT No.: PCT/CN2019/125810
§ 371 (c)(1),
(2) Date: Dec. 29, 2019

(87) PCT Pub. No.: WO2021/109232
PCT Pub. Date: Jun. 10, 2021

(65) Prior Publication Data
US 2021/0325582 A1 Oct. 21, 2021

(30) Foreign Application Priority Data
Dec. 5, 2019 (CN) .......................... 201911233140.2

(51) Int. Cl.
*G02B 5/20* (2006.01)
*G03F 7/00* (2006.01)
(Continued)

(52) U.S. Cl.
CPC .............. *G02B 5/206* (2013.01); *B41M 3/003* (2013.01); *G03F 7/0007* (2013.01); *B82Y 20/00* (2013.01); *B82Y 40/00* (2013.01)

(58) Field of Classification Search
CPC ...... G02B 5/206; B41M 3/003; G03F 7/0007; B82Y 20/00; B82Y 40/00
(Continued)

(56) References Cited

U.S. PATENT DOCUMENTS 9,952,740 B1    4/2018   Kim et al.
2016/0223867 A1 8/2016  Kim et al.
(Continued)

FOREIGN PATENT DOCUMENTS

CN   104156131   11/2014
CN   105044974   11/2015
(Continued)

*Primary Examiner* — Thinh T Nguyen
(74) *Attorney, Agent, or Firm* — PV IP PC; Wei Te Chung; Ude Lu

(57) ABSTRACT

The present invention provides a manufacturing method of a color film substrate and the color film substrate. The manufacturing method includes providing a substrate; forming a first photoresist layer on a first sub-pixel region; forming a quantum dot layer on the substrate, wherein light emission colors of at least two types of quantum dots are respectively different from a light emission color of the first photoresist layer; forming a second photoresist layer and a third photoresist layer on the quantum dot layer in order; and quenching the quantum dot layer to invalidate unshielded quantum dots of the quantum dot layer.

16 Claims, 4 Drawing Sheets

(51) Int. Cl.
  *B82Y 20/00* (2011.01)
  *B41M 3/00* (2006.01)
  *B82Y 40/00* (2011.01)

(58) Field of Classification Search
  USPC .............................................. 359/885; 257/59
  See application file for complete search history.

(56) References Cited

U.S. PATENT DOCUMENTS

| | | |
|---|---|---|
| 2016/0246402 A1 | 8/2016 | Wang |
| 2017/0254933 A1 | 9/2017 | Li |
| 2017/0255056 A1 | 9/2017 | Liu |
| 2017/0256591 A1 | 9/2017 | Li |
| 2017/0315389 A1* | 11/2017 | Chu et al. ............. G02F 1/1335 |
| 2018/0031909 A1 | 2/2018 | Liu |
| 2018/0031911 A1 | 2/2018 | Liu |

FOREIGN PATENT DOCUMENTS

| | | |
|---|---|---|
| CN | 105116604 | 12/2015 |
| CN | 105204103 | 12/2015 |
| CN | 105242449 | 1/2016 |
| CN | 105278153 | 1/2016 |
| CN | 105278155 | 1/2016 |
| CN | 105319765 | 2/2016 |
| CN | 109343267 | 2/2019 |
| KR | 2018-0045974 | 5/2018 |

* cited by examiner

MANUFACTURING METHOD OF COLOR FILM SUBSTRATE AND COLOR FILM SUBSTRATE

RELATED APPLICATIONS

This application is a National Phase of PCT Patent Application No. PCT/CN2019/125810 having International filing date of Dec. 17, 2019, which claims the benefit of priority of Chinese Patent Application No. 201911233140.2 filed on Dec. 5, 2019. The contents of the above applications are all incorporated by reference as if fully set forth herein in their entirety.

FIELD AND BACKGROUND OF THE INVENTION

The present disclosure relates to the display technology field, and more particularly, to a manufacturing method of a color film substrate and the color film substrate.

In current quantum dot color film substrates, additional photomasks are needed to pattern quantum dot layers, which increases manufacturing cost.

An embodiment of the present disclosure provides a manufacturing method of a color film substrate and the color film substrate, in order to resolve a technical problem of high manufacturing cost caused by the current quantum dot color film substrate adopting additional photomasks to pattern quantum dot layers during manufacturing process.

SUMMARY OF THE INVENTION

An embodiment of the present disclosure provides a manufacturing method of a color film substrate comprising following steps: providing a substrate, wherein the substrate comprises a first sub-pixel region, a second sub-pixel region, and a third sub-pixel region; forming a first patterned photoresist layer on the first sub-pixel region of the substrate, wherein the first patterned photoresist layer is a blue photoresist layer; forming a quantum dot layer on the substrate, wherein the quantum dot layer covers the substrate and the first patterned photoresist layer, and the quantum dot layer comprises red quantum dots and green quantum dots; forming a second patterned photoresist layer and a third patterned photoresist layer on the quantum dot layer in order, wherein the second patterned photoresist layer is disposed corresponding to the second sub-pixel region, the third patterned photoresist layer is disposed corresponding to the third sub-pixel region, the second patterned photoresist layer is a red photoresist layer, and the third patterned photoresist layer is a green photoresist layer; and using the second patterned photoresist layer and the third patterned photoresist layer as shielding layers, and quenching the quantum dot layer to invalidate unshielded quantum dots of the quantum dot layer.

Wherein the step of forming a quantum dot layer on the substrate comprises following steps: providing a quantum dot solution mixed at least two types of quantum dots and a solvent; coating or inkjet printing a layer of the quantum dot solution on the substrate; drying the quantum dot solution; and repeating the above steps to obtain a preset thickness quantum dot layer.

In a manufacturing method of a color film substrate of an embodiment of the present disclosure, the solvent is one of petroleum ether, dichloromethane or ethyl acetate.

In a manufacturing method of a color film substrate of an embodiment of the present disclosure, the step of quenching the quantum dot layer adopts a quencher to quench the quantum dot layer, so that a shielded portion of the quantum dot layer forms a first quantum dot layer, and an unshielded portion of the quantum dot layer is quantum dot quenched to form a second quantum dot layer In a manufacturing method of a color film substrate of an embodiment of the present disclosure, the step of quenching the quantum dot layer adopts a quencher to quench the quantum dot layer, so that a shielded portion of the quantum dot layer forms a first quantum dot layer, and an unshielded portion of the quantum dot layer is quantum dot quenched to form a second quantum dot layer.

In a manufacturing method of a color film substrate of an embodiment of the present disclosure, the quencher is one of 12-alkyl mercaptan, 14-alkyl mercaptan or pyridine solution.

In a manufacturing method of a color film substrate of an embodiment of the present disclosure, a step after the step of providing a substrate, that is, before the step of forming a first patterned photoresist layer on the first sub-pixel region of the substrate, comprises forming a black matrix on the substrate.

An embodiment of the present disclosure further provides a manufacturing method of a color film substrate comprising following steps: providing a substrate, wherein the substrate comprises a first sub-pixel region, a second sub-pixel region, and a third sub-pixel region; forming a first patterned photoresist layer on the first sub-pixel region of the substrate; forming a quantum dot layer on the substrate, wherein the quantum dot layer covers the substrate and the first patterned photoresist layer, the quantum dot layer comprises at least two types of quantum dots, and light emission colors of the at least two types of quantum dots are respectively different from a light emission color of the first patterned photoresist layer; forming a second patterned photoresist layer and a third patterned photoresist layer on the quantum dot layer in order, wherein the second patterned photoresist layer is disposed corresponding to the second sub-pixel region, the third patterned photoresist layer is disposed corresponding to the third sub-pixel region; and using the second patterned photoresist layer and the third patterned photoresist layer as shielding layers, and quenching the quantum dot layer to invalidate unshielded quantum dots of the quantum dot layer.

In a manufacturing method of an embodiment of the present disclosure, the step of forming a quantum dot layer on the substrate comprises following step: providing a quantum dot solution mixed at least two types quantum dots and a solvent; coating or inkjet printing a layer of the quantum dot solution on the substrate; drying the quantum dot solution; and repeating the above steps to obtain a preset thickness quantum dot layer.

In a manufacturing method of an embodiment of the present disclosure, the solvent is one of petroleum ether, dichloromethane or ethyl acetate.

In a manufacturing method of an embodiment of the present disclosure, the step of quenching the quantum dot layer adopts a quencher to quench the quantum dot layer, so that a shielded portion of the quantum dot layer forms a first quantum dot layer, and an unshielded portion of the quantum dot layer is quantum dot quenched to form a second quantum dot layer In a manufacturing method of an embodiment of the present disclosure, the quencher is one of 12-alkyl mercaptan, 14-alkyl mercaptan or pyridine solution.

In a manufacturing method of an embodiment of the present disclosure, the first patterned photoresist layer is a blue photoresist layer, the second patterned photoresist layer is a red photoresist layer, the third patterned photoresist layer is a green photoresist layer, and the quantum dot layer comprises red quantum dots and green quantum dots.

In a manufacturing method of a color film substrate of an embodiment of the present disclosure, a step after the step of providing a substrate, that is, before the step of forming a first patterned photoresist layer on the first sub-pixel region of the substrate, comprises forming a black matrix on the substrate.

An embodiment of the present disclosure further provides a color film substrate comprising a substrate, wherein the substrate comprises a first sub-pixel region, a second sub-pixel region, and a third sub-pixel region; a first photoresist layer, wherein the first photoresist layer is disposed on the first sub-pixel region of the substrate; a quantum dot layer, wherein the quantum dot layer is disposed on the substrate and covers the substrate and the first photoresist layer, the quantum dot layer comprises at least two types of quantum dots, and light emission colors of the at least two types of quantum dots are respectively different from a light emission color of the first photoresist layer; a second photoresist layer disposed on a portion of the quantum dot layer corresponding to the second sub-pixel region; and a third photoresist layer disposed on a portion of the quantum dot layer corresponding to the third sub-pixel region.

Wherein the quantum dot layer comprises a first quantum dot layer disposed on the second sub-pixel region and the third sub-pixel region and a second quantum dot layer away from the first quantum dot layer. Under light irradiation, quantum dots in the first quantum dot layer are excited to emit fluorescence of corresponding colors, and quantum dots in the second quantum dot layer are quenched into a light-transmitting state In a color film substrate of an embodiment of the present disclosure, the first photoresist layer is a blue photoresist layer, the second photoresist layer is a red photoresist layer, the third photoresist layer is a green photoresist layer, and the quantum dot layer comprises red quantum dots and green quantum dots.

In a color film substrate of an embodiment of the present disclosure, the color film substrate comprises a black matrix disposed between the substrate and the quantum dot layer.

In a color film substrate of an embodiment of the present disclosure, a refractive index of the substrate is greater than a refractive index of the quantum dot layer.

In a manufacturing method of a color film substrate of the present disclosure, a quantum dot layer is formed on a substrate and covers the substrate and a first photoresist layer, then a second photoresist layer and a third photoresist layer are formed on the quantum dot layer. Finally the second photoresist layer and the third photoresist layer are used as shielding layers, and the quantum dot layer is quenched to invalidate an exposed portion of the quantum dot layer. In other words, a portion of the quantum dot layer covering the first photoresist layer loses a function of emitting fluorescence, and a portion of the quantum dot layer corresponding to the second photoresist layer and the third photoresist layer retains the function of emitting fluorescence.

In a manufacturing method of a color film substrate of the present disclosure, a second photoresist layer and a third photoresist layer are used as shielding layers, and the quantum dot layer is quenched, which save a process of forming patterned quantum dot layers by using photomasks, thereby saving the photomasks and reducing costs.

BRIEF DESCRIPTION OF THE SEVERAL VIEWS OF THE DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DESCRIPTION OF SPECIFIC EMBODIMENTS OF THE INVENTION

Figure 1:
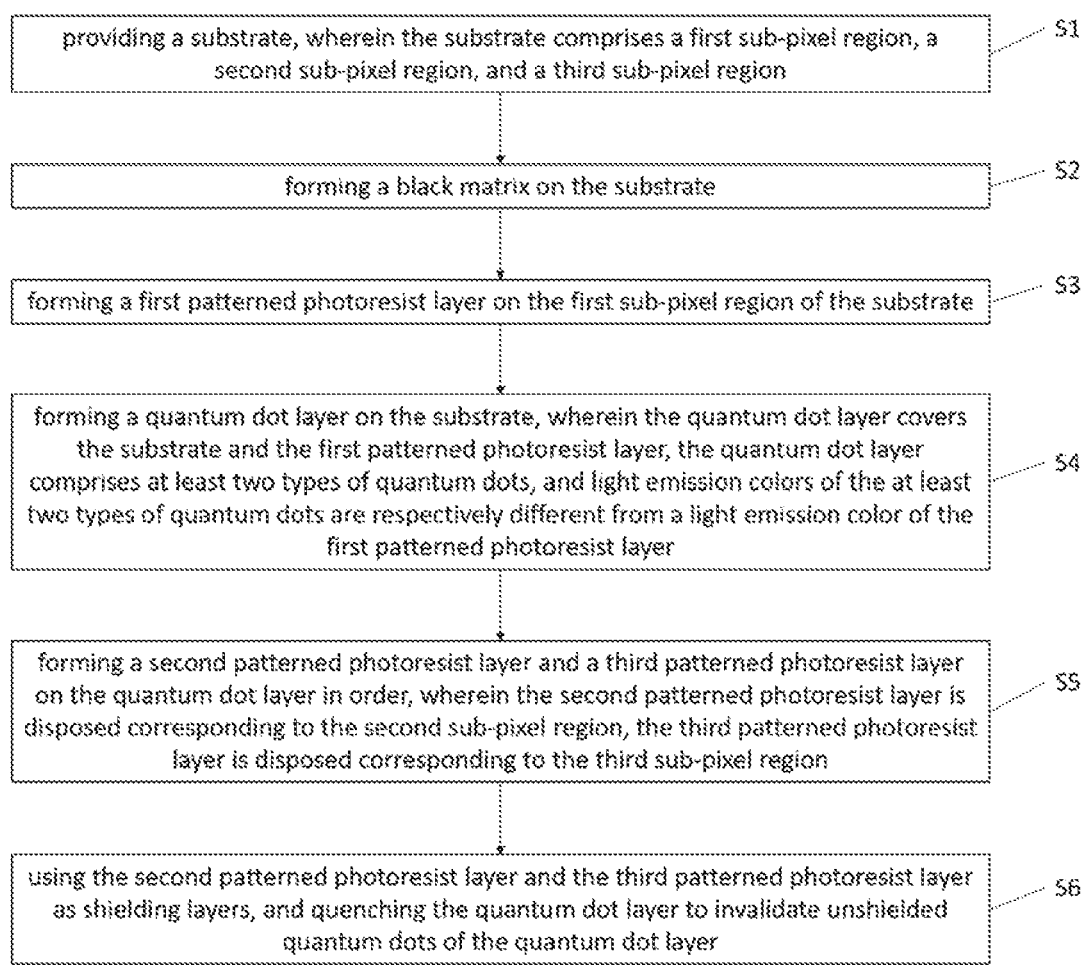
FIG. 1 is a flowchart of a manufacturing method of a color film substrate in an embodiment of the present disclosure.

Referring to the drawings, wherein the same component symbols represent the same components. The following description is based on the exemplified specific embodiments of the present disclosure, it should not be construed as limiting other specific embodiments not detailed herein.

Referring to FIG. 1 and FIG. 1A to FIG. 1F, FIG. 1 is a flowchart of a manufacturing method of a color film substrate in an embodiment of the present disclosure, and FIG. 1A to FIG. 1F are a schematic structural diagram of steps S1 to S6 of the manufacturing method of the color film substrate in an embodiment of the present disclosure in order.

The manufacturing method of the color film substrate in an embodiment of the present disclosure comprises following steps.

Step S1: providing a substrate 11, wherein the substrate 11 comprises a first sub-pixel region 11a, a second sub-pixel region 11b, and a third sub-pixel region 11c.

Step S2: forming a black matrix 12 on the substrate 11, wherein the black matrix 12 separates the first sub-pixel region 11a, the second sub-pixel region 11b, and the third sub-pixel region 11c from each other.

Step S3: forming a first photoresist layer 13, which is patterned on the first sub-pixel region 11a of the substrate 11.

Step S4: forming a quantum dot layer 14 on the substrate 11, wherein the quantum dot layer 14 covers the substrate 11, the black matrix 12, and the first photoresist layer 13, the quantum dot layer 14 comprises at least two types of quantum dots, and light emission colors of the at least two types of quantum dots are respectively different from a light emission color of the first photoresist layer 13.

Step S5: forming a second photoresist layer 15 and a third photoresist layer 16, which are patterned on the quantum dot layer 14 in order, the second photoresist layer 15 is disposed corresponding to the second sub-pixel region 11b, and the third patterned photoresist layer 16 is disposed corresponding to the third sub-pixel region 11c.

Step S6: using the second photoresist layer 15 and the third photoresist layer as shielding layers, and quenching the quantum dot layer 14 to invalidate unshielded quantum dots of the quantum dot layer 14.

In the manufacturing method of the color film substrate in the present embodiment, the second photoresist layer 15 and the third photoresist layer 16 are used as shielding layers, and the quantum dot layer is quenched, which replaces a process of forming patterned quantum dot layers by using photomasks, thereby saving the photomasks and reducing costs.

In the manufacturing method of the color film substrate of the present embodiment, the quantum dot layer 14 is formed on the substrate 11 and covers the substrate 11 and the first photoresist layer 13, then the second photoresist layer 15 and the third photoresist layer 16 are formed on the quantum dot layer 14. Finally the second photoresist layer 15 and the third photoresist layer 16 are used as shielding layers, and the quantum dot layer 14 is quenched to invalidate an exposed portion of the quantum dot layer 14. In other words, a portion of the quantum dot layer 14 covering the first photoresist layer 13 loses a function of emitting fluorescence, and a portion of the quantum dot layer 14 corresponding to the second photoresist layer 15 and the third photoresist layer 16 retains the function of emitting fluorescence.

The following is a detailed description of the manufacturing method of the color film substrate in the embodiment of the present disclosure.

Figure 1A:
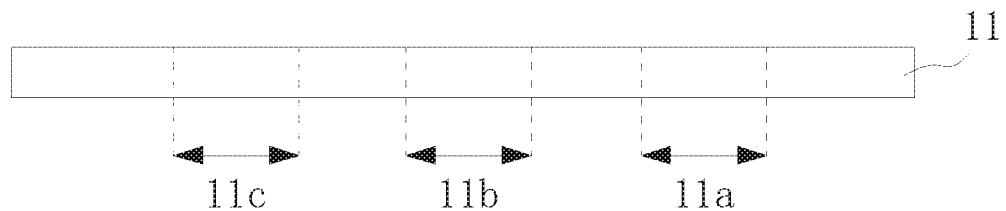
FIGS. 1A, 1B, 1C, 1D, 1E and FIG. 1F are a schematic structural diagram of steps S1 to S6 of the manufacturing method of the color film substrate in the embodiment of the present disclosure in order.

Referring to FIG. 1A, in the step S1: providing the substrate 11. The substrate 11 comprises the first sub-pixel region 11a, the second sub-pixel region 11b, and the third sub-pixel region 11c.

The substrate 11 may be a rigid substrate, such as a glass substrate. The substrate 11 may also be a flexible substrate, such as a polyimide substrate. Then, go to the step S2.

Figure 1B:
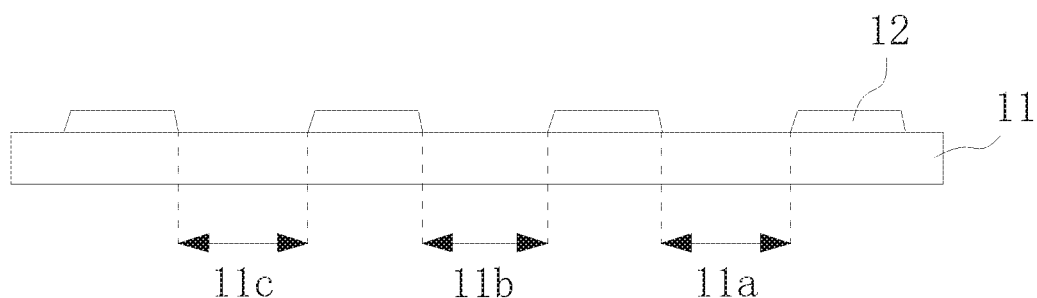

Referring to FIG. 1B, in the step S2: forming the black matrix 12 on the substrate 11. The black matrix 12 separates the first sub-pixel region 11a, the second sub-pixel region 11b, and the third sub-pixel region 11c from each other.

A material of the black matrix 12 may be a black metal material, or a black organic or inorganic material. The black matrix 12 may be formed on the substrate 11 by a photolithography process or an inkjet printing process. Then, go to the step S3.

Figure 1C:
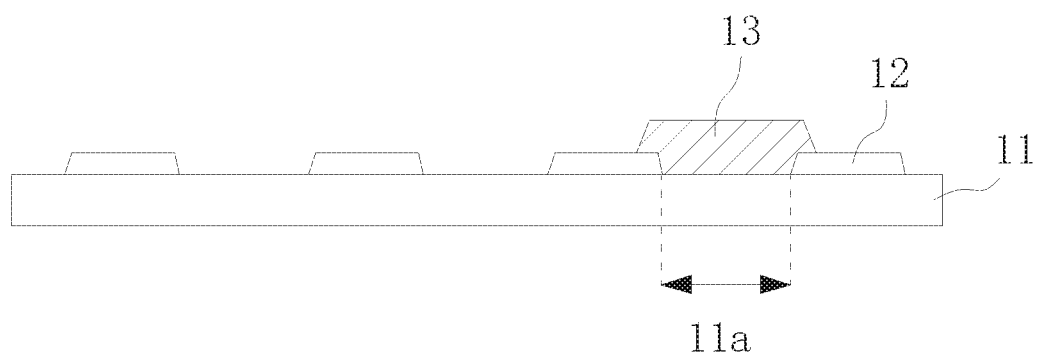

Referring to FIG. 1C, in the step S3: forming the first photoresist layer 13 which is patterned on the first sub-pixel region 11a of the substrate 11.

In the present embodiment, the first photoresist layer 13 is a blue photoresist layer. The first photoresist layer 13 is patterned by a photolithography process. Then, go to the step S4.

Figure 1D:
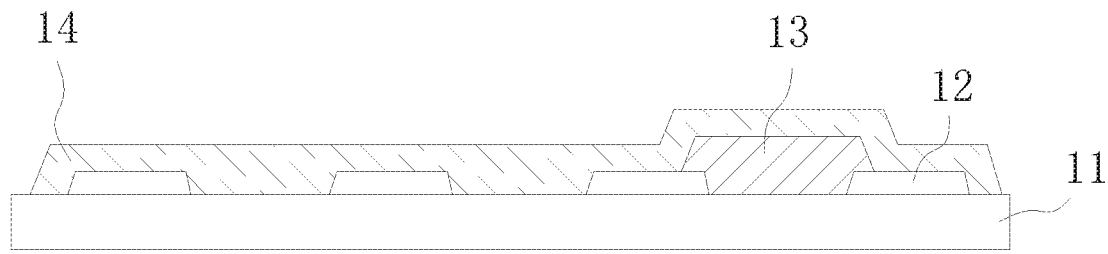

Referring to FIG. 1D, in the step S4: forming the quantum dot layer 14 on the substrate 11. The quantum dot layer 14 covers the substrate 11, the black matrix 12, and the first photoresist layer 13. The quantum dot layer 14 comprises at least two types of quantum dots, and light emission colors of the at least two types of quantum dots are respectively different from a light emission color of the first photoresist layer 13.

Figure 2:
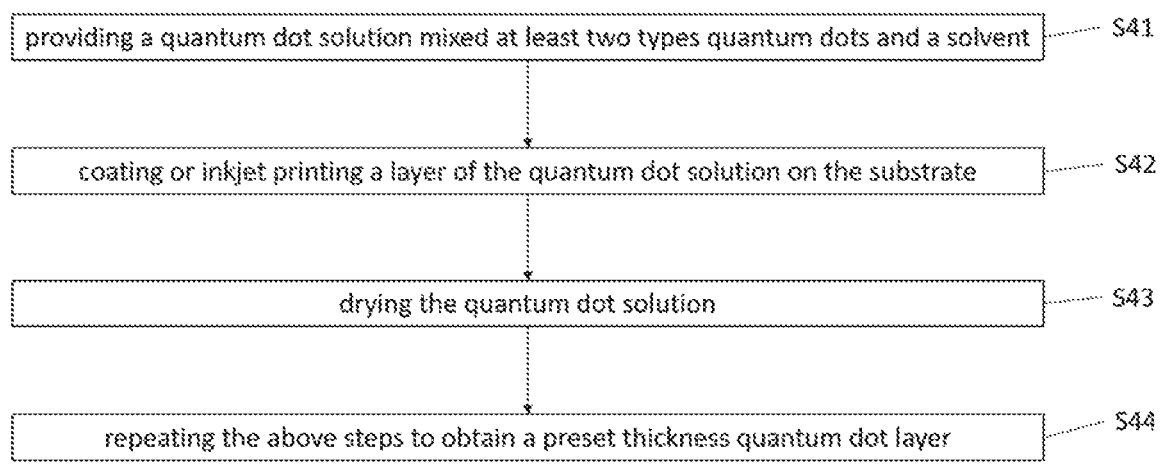
FIG. 2 is a flowchart of the step S4 of the manufacturing method of the color film substrate in the embodiment of the present disclosure.
Figure 3:
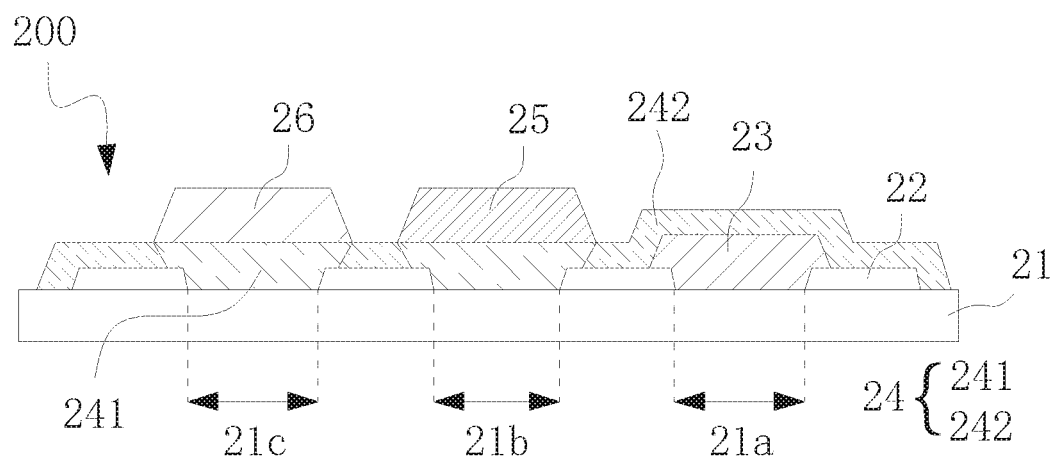
FIG. 3 is a schematic structural diagram of the color film substrate in the embodiment of the present disclosure.

Specifically, referring to FIG. 2, the step S4 comprises following steps.

Step S41: providing a quantum dot solution mixed with at least two types of quantum dots and a solvent.

Step S42: coating or inkjet printing a layer of the quantum dot solution on the substrate.

Step S43: drying the quantum dot solution.

Step S44: repeating the above steps to obtain a quantum dot layer with preset thickness.

In the step S41, the solvent in the quantum dot solution is a low boiling point solvent, and the solvent is one of petroleum ether, dichloromethane, or ethyl acetate.

In the present embodiment, there are two types of the quantum dots, which are red quantum dots and green quantum dots. In other embodiments, there may also be more than two types of the quantum dots, such as white quantum dots, red quantum dots, and green quantum dots. In short, the light emission color of the quantum dots may be different from the light emission color of the first photoresist layer 13.

Therefore, in the present embodiment, the quantum dot solution is obtained by treating the oil-soluble red quantum dots and green quantum dots dispersed in a low boiling point solvent. Then, go to the step S42.

In the step S42, forming a layer of the quantum dot solution on the substrate 11 by coating or inkjet printing. Then, go to the step S43.

In the step S43, drying the quantum dot solution by heating. That is, the solvent in the quantum dot solution is evaporated by heating. Due to low boiling point substance of the solvent, the temperature required for heating is low, so that characteristics of the quantum dots and the first photoresist layer 13 are not damaged. Then, go to the step S44.

In the step S44, repeating the step S41 to S43 to obtain the quantum dot layer with preset thickness. Repeating the steps S41 to S43 multiple times to sequentially increase the thickness of the quantum dot layer 14 until it meets the preset thickness. In the present embodiment, a thickness of the quantum dot layer 14 ranges from 0.5 μm to 5 μm.

Furthermore, a refractive index of the quantum dot layer 14 is less than a refractive index of the substrate 11, so that incident angles of light is greater than critical angles of light and the light will have total internal reflection at an interface when the light enters an interface between the substrate 11 and the quantum dot layer 14. An energy of the light (evanescent wave) will enter a certain depth of the quantum dot layer 14 while in reflection. Thus, the quantum dots are excited to emit fluorescence, and the luminous efficiency of the quantum dots is improved. Then, go to the step S5.

Figure 1E:
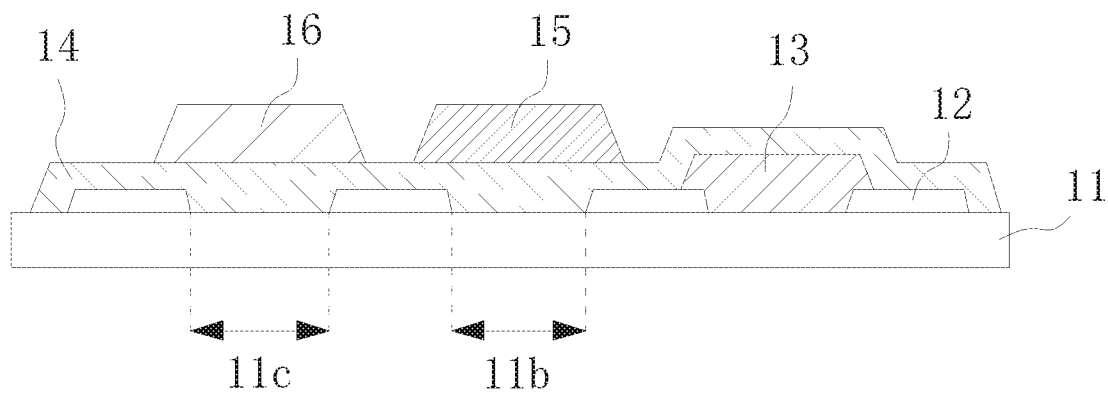

Referring to FIG. 1E, in the step S5: forming the second photoresist layer 15 and the third photoresist layer 16, which are patterned on the quantum dot layer 14 in order. The second patterned photoresist layer 15 is disposed corresponding to the second sub-pixel region 11b, and the third patterned photoresist layer 16 is disposed corresponding to the third sub-pixel region 11c.

Specifically, an orthographic projection of the second photoresist layer 15 on a plane where the substrate 11 is located on the second sub-pixel region 11b. An orthographic projection of the third photoresist layer 16 on a plane where the substrate 11 is located on the third sub-pixel region 11c.

In the present embodiment, the second photoresist layer 15 is a red photoresist layer, and the third photoresist layer 16 is a green photoresist layer. The second photoresist layer 15 and the third photoresist layer 16 which are patterned are formed by a photolithography process. Then, go to the step S6.

Figure 1F:
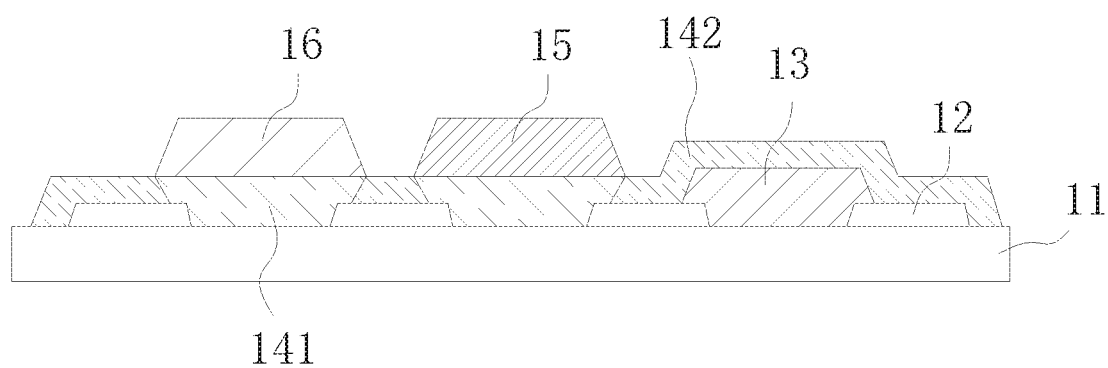

Referring to FIG. 1F, in the step S6: using the second photoresist layer 15 and the third photoresist layer as shielding layers, and quenching the quantum dot layer 14 to invalidate unshielded quantum dots of the quantum dot layer 14.

Specifically, adopting a quencher to quench the quantum dot layer 14, so that a shielded portion of the quantum dot layer 14 forms a first quantum dot layer 141, and an unshielded portion of the quantum dot layer 14 is quantum dot quenched to form a second quantum dot layer 142. The quencher is an organic reagent with electron-withdrawing ability, such as one of 12-alkyl mercaptan, 14-alkyl mercaptan or pyridine solution.

It should be noted that, due to characteristics of a surface effect of quantum dots, according to the characteristics, changes in surface properties have a huge impact on material characteristics of quantum dot materials. Wherein, the most important of which is influences of optical properties, and different types of surface ligands have different effects on the quantum dots. For example, long alkyl chain fatty amines and fatty acids may effectively passivate surface electron traps on the surface of quantum dots, and ligands such as pyridine or thiol, due to their excessive electronegativity and strong electron-withdrawing ability, once they act on the surface of quantum dots, they will induce generation of new surface electron defects and have a strong ability to attract excited electrons. To some degree, it will cause recombination obstacle of photo-generated electrons and holes, which will cause fluorescence quenching.

After the unshielded portion of the quantum dot layer 14 is quenched by fluorescence, it loses the ability to be excited to emit fluorescence, and has light-transmitting properties.

This completes the process of the manufacturing method of color film substrate in the embodiment of the present disclosure.

In other embodiments of the present disclosure, a first photoresist layer, a second photoresist layer, and a third photoresist layer may be different color photoresist layers from the present embodiment. For example, the first photoresist layer, the second photoresist layer, and the third photoresist layer are red, green, and blue photoresist layers in order. A type of quantum dots contained in the quantum dot layer is only required to have two types of quantum dots different from the color of the first photoresist layer, such as green quantum dots and blue quantum dots.

An embodiment of the present disclosure further provides a color film substrate 200 comprising a substrate 21, a black matrix 22, a first photoresist layer 23, a quantum dot layer 24, a second photoresist layer 25, and a third photoresist layer 26. The substrate comprises a first sub-pixel region 21a, a second sub-pixel region 21b, and a third sub-pixel region 21c.

The black matrix 22 is disposed on the substrate 21 and separates the first sub-pixel region 21a, the second sub-pixel region 21b, and the third sub-pixel region 21c from each other. The first photoresist layer 23 is disposed on the first sub-pixel region 21a of the substrate 21. The quantum dot layer 24 is disposed on the substrate 21 and covers the substrate 21 and the first photoresist layer 23. The second photoresist layer 25 is disposed on a portion of the quantum dot layer 24 corresponding to the second sub-pixel region 21b. The third photoresist layer 26 is disposed on a portion of the quantum dot layer 24 corresponding to the third sub-pixel region 21c.

Wherein, the quantum dot layer 24 comprises at least two types of quantum dots, and light emission colors of the at least two types of quantum dots are respectively different from a light emission color of the first photoresist layer 23.

Under light irradiation, quantum dots in the first quantum dot layer 241 are excited to emit fluorescence of corresponding colors, and quantum dots in the second quantum dot layer 242 are quenched into a light-transmitting state.

The color film substrate 200 in the present embodiment adopts a method of partially quenching the quantum dot layer which replaces a method of patterning the quantum dot layer with photomasks, resulting in saving costs of the photomasks.

In the color film substrate 200 of the present embodiment, the first photoresist layer 23 is a blue photoresist layer, the second photoresist layer 25 is a red photoresist layer, the third photoresist layer 26 is a green photoresist layer, and the quantum dot layer 24 comprises red quantum dots and green quantum dots.

In other embodiments, a first photoresist layer, a second photoresist layer, and a third photoresist layer may be different color photoresist layers from the present embodiment. For example, the first photoresist layer, the second photoresist layer, and the third photoresist layer are red, green, and blue photoresist layers in order. A type of quantum dots contained in the quantum dot layer is only required to have two types of quantum dots different from the color of the first photoresist layer, such as green quantum dots and blue quantum dots.

In the color film substrate 200 of the present embodiment, a refractive index of the substrate 21 is greater than a refractive index of the quantum dot layer 24, so that incident angles of light is greater than critical angles of light and the light will have total internal reflection at an interface when the light enters an interface between the substrate 21 and the quantum dot layer 24. An energy of the light (evanescent wave) will enter a certain depth of the quantum dot layer 24 while in reflection. Thus, the quantum dots are excited to emit fluorescence, and the luminous efficiency of the quantum dots is improved.

In the present embodiment, light of light source irradiating the color filter substrate 200 in the present embodiment is blue light. Therefore, the blue light is a short wave, which may better excite quantum dots, so that it has a high color gamut when it is applied in display panels.

Furthermore, the color film substrate 200 in the present embodiment may be applied in liquid crystal display panels, organic light-emitting diode (OLED) display panels, light-emitting diode (LED) display panels, or backlight modules.

When the color film substrate 200 in the present embodiment is used as a portion of the backlight modules, it is fine as long as the light is white after light emission color of the first photoresist layer, the second photoresist layer, and the third photoresist layer are mixed. Wherein, types of quantum dots in the quantum dot layer are also correspondingly complementary to the color of the first photoresist layer to form three primary colors (red, green, and blue).

For details of the manufacturing method of the color filter substrate of the present embodiment, please refer to the content of the manufacturing scheme of the color filter substrate of the above embodiment, and they will not be repeated herein.

In a manufacturing method of a color film substrate of the present disclosure, a quantum dot layer is formed on a substrate and covers the substrate and a first photoresist layer, and then a second photoresist layer and a third photoresist layer are formed on the quantum dot layer. Finally the second photoresist layer and the third photoresist layer are used as shielding layers, and the quantum dot layer is quenched to invalidate an exposed portion of the quantum dot layer. In other words, a portion of the quantum dot layer covering the first photoresist layer loses a function of emitting fluorescence, and a portion of the quantum dot layer corresponding to the second photoresist layer and the third photoresist layer retains the function of emitting fluorescence.

In a manufacturing method of a color film substrate of the present disclosure, a second photoresist layer and a third photoresist layer are used as shielding layers, and the quantum dot layer is quenched, which save a process of forming patterned quantum dot layers by using photomasks, thereby saving the photomasks and reducing costs.

As mentioned above, for those of ordinary skill in the art, various other corresponding changes and modifications can be made according to the technical solutions and technical concepts of the present disclosure, and all these changes and modifications should belong to the protection scope of the claims attached to the present disclosure.

What is claimed is:

1. A manufacturing method of a color film substrate, comprising following steps:
   providing a substrate, wherein the substrate comprises a first sub-pixel region, a second sub-pixel region, and a third sub-pixel region;
   forming a first patterned photoresist layer on the first sub-pixel region of the substrate, wherein the first patterned photoresist layer is a blue photoresist layer;
   forming a quantum dot layer on the substrate, wherein the quantum dot layer covers the substrate and the first patterned photoresist layer, and the quantum dot layer comprises red quantum dots and green quantum dots;
   forming a second patterned photoresist layer and a third patterned photoresist layer on the quantum dot layer in order, wherein the second patterned photoresist layer is disposed corresponding to the second sub-pixel region, the third patterned photoresist layer is disposed corresponding to the third sub-pixel region, the second patterned photoresist layer is a red photoresist layer, and the third patterned photoresist layer is a green photoresist layer; and
   using the second patterned photoresist layer and the third patterned photoresist layer as shielding layers, and quenching the quantum dot layer to invalidate unshielded quantum dots of the quantum dot layer;
   wherein the step of forming the quantum dot layer on the substrate comprises following steps:
   providing a quantum dot solution mixed with at least two types of quantum dots and a solvent;
   coating or inkjet printing a layer of the quantum dot solution on the substrate;
   drying the quantum dot solution; and
   repeating the above steps to obtain the quantum dot layer with a preset thickness.

2. The manufacturing method of the color film substrate as claimed in claim 1, wherein the solvent is one of petroleum ether, dichloromethane, or ethyl acetate.

3. The manufacturing method of the color film substrate as claimed in claim 1, wherein the step of quenching the quantum dot layer adopts a quencher to quench the quantum dot layer, so that a shielded portion of the quantum dot layer forms a first quantum dot layer, and an unshielded portion of the quantum dot layer is quantum dot quenched to form a second quantum dot layer.

4. The manufacturing method of the color film substrate as claimed in claim 3, wherein the quencher is one of 12-alkyl mercaptan, 14-alkyl mercaptan, or pyridine solution.

5. The manufacturing method of the color film substrate as claimed in claim 1, wherein a step after the step of providing the substrate, that is, before the step of forming the first patterned photoresist layer on the first sub-pixel region of the substrate, comprises forming a black matrix on the substrate.

6. A manufacturing method of a color film substrate, comprising following steps:
   providing a substrate, wherein the substrate comprises a first sub-pixel region, a second sub-pixel region, and a third sub-pixel region;
   forming a first patterned photoresist layer on the first sub-pixel region of the substrate;
   forming a quantum dot layer on the substrate, wherein the quantum dot layer covers the substrate and the first patterned photoresist layer, the quantum dot layer comprises at least two types of quantum dots, and light emission colors of the at least two types of quantum dots are respectively different from a light emission color of the first patterned photoresist layer;
   forming a second patterned photoresist layer and a third patterned photoresist layer on the quantum dot layer in order, wherein the second patterned photoresist layer is disposed corresponding to the second sub-pixel region, and the third patterned photoresist layer is disposed corresponding to the third sub-pixel region; and
   using the second patterned photoresist layer and the third patterned photoresist layer as shielding layers, and quenching the quantum dot layer to invalidate unshielded quantum dots of the quantum dot layer.

7. The manufacturing method of the color film substrate as claimed in claim 6, wherein the step of forming the quantum dot layer on the substrate comprises following steps:
   providing a quantum dot solution mixed with the at least two types of quantum dots and a solvent;
   coating or inkjet printing a layer of the quantum dot solution on the substrate;
   drying the quantum dot solution; and
   repeating the above steps to obtain the quantum dot layer with a preset thickness.

8. The manufacturing method of the color film substrate as claimed in claim 7, wherein the solvent is one of petroleum ether, dichloromethane, or ethyl acetate.

9. The manufacturing method of the color film substrate as claimed in claim 7, wherein the step of quenching the quantum dot layer adopts a quencher to quench the quantum dot layer, so that a shielded portion of the quantum dot layer forms a first quantum dot layer, and an unshielded portion of the quantum dot layer is quantum dot quenched to form a second quantum dot layer.

10. The manufacturing method of the color film substrate as claimed in claim 9, wherein the quencher is one of 12-alkyl mercaptan, 14-alkyl mercaptan, or pyridine solution.

11. The manufacturing method of the color film substrate as claimed in claim 6, wherein the first patterned photoresist layer is a blue photoresist layer, the second patterned photoresist layer is a red photoresist layer, the third patterned photoresist layer is a green photoresist layer, and the quantum dot layer comprises a red quantum dot and a green quantum dot.

12. The manufacturing method of the color film substrate as claimed in claim 6, wherein a step after the step of providing the substrate, that is, before the step of forming the first patterned photoresist layer on the first sub-pixel region of the substrate, comprises forming a black matrix on the substrate.

13. A color film substrate, comprising:
   a substrate, comprising a first sub-pixel region, a second sub-pixel region, and a third sub-pixel region;
   a first photoresist layer disposed on the first sub-pixel region of the substrate;

a quantum dot layer disposed on the substrate and covering the substrate and the first photoresist layer, wherein the quantum dot layer comprises at least two types of quantum dots, and light emission colors of the at least two types of quantum dots are respectively different from a light emission color of the first photoresist layer;

a second photoresist layer disposed on a portion of the quantum dot layer corresponding to the second sub-pixel region; and a third photoresist layer disposed on a portion of the quantum dot layer corresponding to the third sub-pixel region;

wherein the quantum dot layer comprises a first quantum dot layer disposed on the second sub-pixel region and the third sub-pixel region and a second quantum dot layer away from the first quantum dot layer; and under light irradiation, quantum dots in the first quantum dot layer are excited to emit fluorescence of corresponding colors, and quantum dots in the second quantum dot layer are quenched into a light-transmitting state.

14. The color film substrate as claimed in claim 13, wherein the first photoresist layer is a blue photoresist layer, the second photoresist layer is a red photoresist layer, the third photoresist layer is a green photoresist layer, and the quantum dot layer comprises red quantum dots and green quantum dots.

15. The color film substrate as claimed in claim 13, wherein the color film substrate comprises a black matrix disposed between the substrate and the quantum dot layer.

16. The color film substrate as claimed in claim 13, wherein a refractive index of the substrate is greater than a refractive index of the quantum dot layer.

\* \* \* \* \*